United States Patent
Liu et al.

(10) Patent No.: US 9,266,151 B2
(45) Date of Patent: Feb. 23, 2016

(54) CLEANING DEVICE RESISTANT TO LIQUID BACKSPLASH AND CLEANING SYSTEM THEREWITH

(71) Applicant: Beijing Sevenstar Electronics Co., Ltd., Beijing (CN)

(72) Inventors: Xiaoyan Liu, Beijing (CN); Yi Wu, Beijing (CN); Xiaomin Feng, Beijing (CN)

(73) Assignee: BEIJING SEVENSTAR ELECTRONICS CO., LTD., Beijing (CN)

( * ) Notice: Subject to any disclaimer, the term of this patent is extended or adjusted under 35 U.S.C. 154(b) by 120 days.

(21) Appl. No.: 14/127,972

(22) PCT Filed: Apr. 1, 2013

(86) PCT No.: PCT/CN2013/073572
§ 371 (c)(1),
(2) Date: Dec. 20, 2013

(87) PCT Pub. No.: WO2014/082402
PCT Pub. Date: Jun. 5, 2014

(65) Prior Publication Data
US 2015/0206771 A1  Jul. 23, 2015

(30) Foreign Application Priority Data
Nov. 28, 2012 (CN) .......................... 2012 1 0494618

(51) Int. Cl.
*H01L 21/306* (2006.01)
*B08B 3/02* (2006.01)
*H01L 21/67* (2006.01)

(52) U.S. Cl.
CPC ............ *B08B 3/02* (2013.01); *H01L 21/67051* (2013.01)

(58) Field of Classification Search
CPC ....................................................... B08B 3/02
See application file for complete search history.

(56) References Cited

U.S. PATENT DOCUMENTS

2004/0231188 A1* 11/2004 Lauerhaas et al. ............... 34/594
2012/0142196 A1*  6/2012 Rye et al. ....................... 438/758

FOREIGN PATENT DOCUMENTS

JP          58123731 A  *  7/1983  ............ H01L 21/306

* cited by examiner

*Primary Examiner* — Michael Barr
*Assistant Examiner* — Jason Riggleman

(57) ABSTRACT

The present invention provides a cleaning device resistant to liquid backsplash comprises an upper casing and a lower casing. The upper casing moves upward and downward relative to the lower casing. The upper casing comprises an inner wall, an outer wall, and a hollow cavity formed therebetween. The inner wall is provided with a plurality of liquid inlet apertures which are communicated with the hollow cavity. Through the liquid inlet apertures and the hollow cavity provided in the cleaning device and the cleaning system of the present invention, the chemical liquids and/or particles used are introduced into the hollow cavity via the liquid inlet apertures and discharged via the liquid discharging apertures during the high speed rotation of the wafer so as to achieve better cleaning device.

13 Claims, 3 Drawing Sheets

CLEANING DEVICE RESISTANT TO LIQUID BACKSPLASH AND CLEANING SYSTEM THEREWITH

CROSS-REFERENCE TO RELATED APPLICATION

This application claims the priority benefit of International Patent Application Serial No. PCT/CN2013/073,572, filed Apr. 1, 2013, which is related to and claims the priority benefit of China patent application serial no. 201210494618.9 filed Nov. 28, 2012. The entirety of each of the above-mentioned patent applications is hereby incorporated by reference herein and made parts of this specification.

FIELD OF THE INVENTION

The present invention relates to the field of semiconductor processing technology, more particularly to a cleaning device resistant to liquid backsplash and a cleaning system with the cleaning device.

BACKGROUND OF THE INVENTION

With the increase of the wafer diameter and the decrease of the critical dimension, the surface cleanliness of the wafer becomes more demanding. Currently, the cleaning apparatus achieves the cleaning effects through spraying cleaning solutions to the surface of the high speed rotating wafer. However, during the high speed rotation of the wafer, the cleaning solution will be flung off the wafer surface and collide with a surrounding process chamber wall under the centrifugal force, then backsplash may occur, which may result in the cleaning solution being returned to the wafer surface and contaminating the wafer. Such contamination will degrade the cleaning process performance. Prior art attempts to prevent such contamination by increasing the structural complexity of the process chamber through providing additional components in the process chamber. However, it becomes difficult to perform the subsequent cleaning processes in the process chamber.

SUMMARY OF THE INVENTION

Accordingly, one objective of the present invention is to provide a cleaning device resistant to liquid backsplash and a cleaning system provided therewith to prevent the chemical liquids or the particles cleaned which are flung from the wafer and collide with the chamber wall splashing back to the wafer surface again to cause contamination as well as to overcome the defects of the cleaning process difficulties due to the complex device structure.

These and other objectives are met by the present invention, which in one aspect can be a cleaning device resistant to liquid backsplash. The cleaning device resistant to liquid backsplash comprises an upper casing and a lower casing. The upper casing moves upward and downward relative to the lower casing. The upper casing comprises an inner wall, an outer wall, and a hollow cavity formed therebetween. The inner wall is provided with a plurality of liquid inlet apertures which are communicated with the hollow cavity.

Furthermore, the upper casing is connected with at least one driving column by which the upper casing moves upward and downward relative to the lower casing.

Furthermore, the lower portion of the upper casing overlaps with at least parts of the top portion of the lower casing when the upper casing moves to a high position.

Furthermore, the thickness of the hollow cavity is 0.3 cm to 0.8 cm.

Furthermore, the thickness of the inner wall is less than or equal to that of the outer wall.

Furthermore, the liquid inlet aperture is round with a diameter of 0.5 cm to 1.5 cm.

Furthermore, the liquid inlet apertures are uniformly distributed along the circumference of the inner wall.

Furthermore, the lower casing is provided with liquid discharging apertures which are communicated with the bottom of the hollow cavity.

Another aspect can be a cleaning system provided with the cleaning device resistant to liquid backsplash method above.

Furthermore, the cleaning system also comprises a holder positioned in the internal of the cleaning device. The holder comprises a chuck for supporting, clamping and rotating the wafer.

According to the present invention, the chemical liquids and/or particles used are introduced into the hollow cavity through the liquid inlet apertures and discharged through the liquid discharging apertures during the high speed rotation of the wafer, thereby achieving better cleaning effects. In addition, the structure of the cleaning device is simple and easy to clean. The cleaning process can be performed easily and the waste liquids can be collected conveniently.

BRIEF DESCRIPTION OF THE DRAWINGS

The cleaning device of the present invention will be elucidated by reference to the following embodiments and the accompanying drawings, in which.

DETAILED DESCRIPTION OF THE EMBODIMENTS

Figure 1:
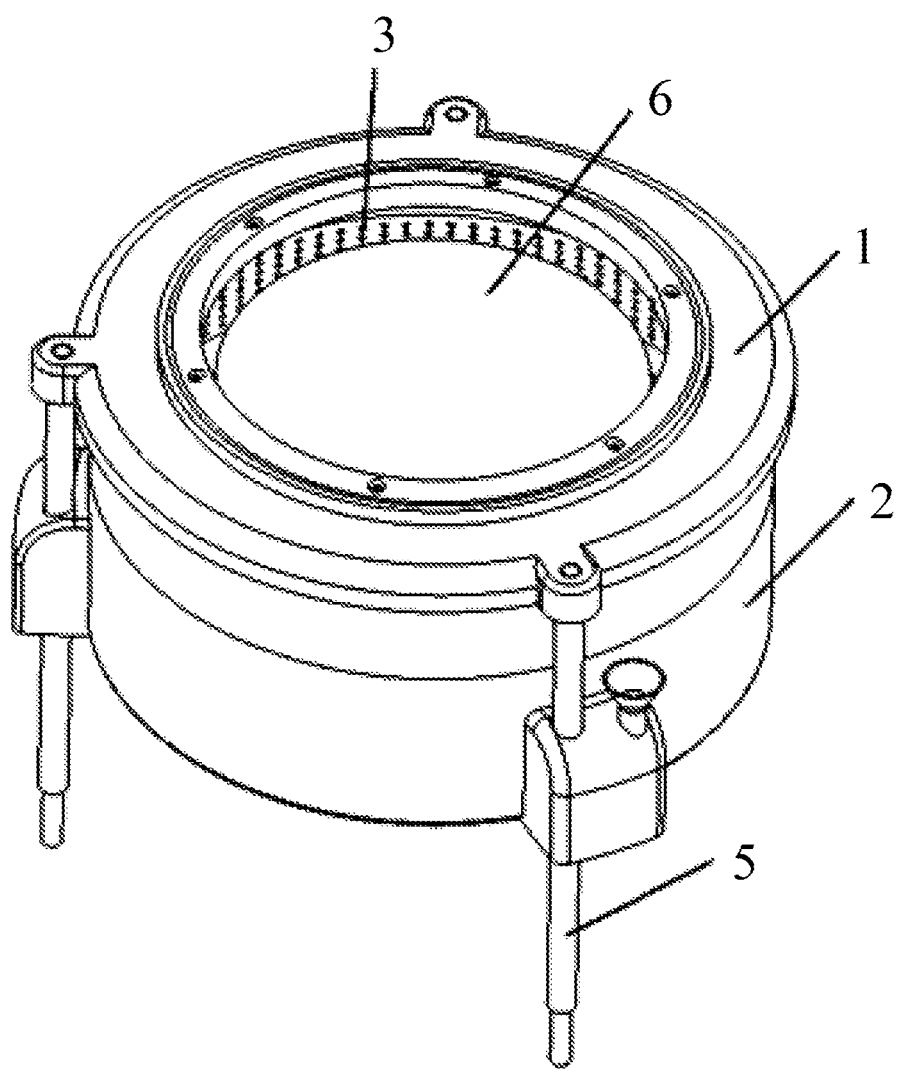
FIG. 1 is a schematic view showing the cleaning device according to an embodiment of the present invention.

The cleaning device and cleaning system of the presently preferred embodiments are discussed in further details hereinafter with respect the embodiments and the accompanying drawings. However, the embodiments described herein are not the only applications or uses contemplated for the invention. The specific embodiments discussed are merely illustrative of specific ways to make and use the invention, and do not limit the scope of the invention or the appended claims.

For the description that follows, when the terms "center", "longitude", "lateral", "above", "below", "front", "back", "left", "right", "vertical", "horizontal", "top", "bottom", "inner", "outer" and similar terms are used herein, it should be understood that these terms have reference only to the structures shown in the drawings as it would appear to a person viewing the drawings and are utilized only to facilitate describing the invention. No limitation is intended or should be attached.

The terms "first", "second", "third" are merely used to describe the invention and do not indicate or suggest the relative importance.

The terms "mount", "connect", "communicate" are used in a broad sense unless otherwise indicated or limited to encompass any of a fixed connection, a detachable connection or an integral connection; a mechanical connection or an electrical connection; a direct connection, an indirect connection via intermediates or an inter connection between two components. Persons having ordinary skill in the art can fully understand the meaning of these terms in accordance with the specific conditions.

The term "wafer" is intended to include a bulk silicon wafer or a wafer with copper interconnections.

The term "high position" refers to a position where the upper casing 1 is driven up; the term "low position" refers to a position where the upper casing 1 is driven down. When the upper casing 1 is in the high position, the lower portion of the upper casing 1 overlaps with at least parts of the top portion of the lower casing 2; when the upper casing 1 is in the low position, the upper casing 1 and the lower casing 2 are substantially overlapped.

First Embodiment

As shown in FIG. 1 to FIG. 4, the cleaning device resistant to liquid backsplash comprises an upper casing 1 and a lower casing 2. The lower casing 2 is disposed at the lower part of the cleaning device. The upper casing 1 can move up and down relative to the lower casing 2. Before the process, the upper casing 1 moves upward relative to the lower casing 2. The upper casing 1 rises so as to protect the wafer 6 in the interior of the upper casing 1 and prevent the sputtered liquid splashing to the outside of the cleaning device. After the cleaning process, the upper casing 1 moves downward relative to the lower casing 2. The upper casing 1 is lowered for picking up the wafer 6 conveniently. Specifically, the upper casing 1 is a non-solid structure, it comprises an inner wall and an outer wall. A hollow cavity 4 forms between the inner wall and the outer wall. The inner wall is provided with a plurality of liquid inlet apertures 3, each of which is communicated with the hollow cavity 4. More liquid inlet apertures 3 are preferred, if not weaken the upper casing 1 strength, so that all of the sputtered liquids can be introduced into the hollow cavity 4 through the liquid inlet apertures 3 during the high speed rotation of the wafer 6. A driving column 5 is connected with the upper casing 1 at the edge of the upper casing 1 to drive it up and down relative to the lower casing 2. The number of the driving column 5 can be more than one. Multiple driving columns 5 can be distributed uniformly along the edge of the upper casing 1. As shown in FIG. 1, three driving columns 5 are distributed uniformly. The driving columns 5 are driven by a cylinder (not shown).

Both the inner wall and the outer wall can be cylindrical or ring-shaped. The total thickness of the inner wall and the outer wall is 1.2 cm to 2 cm, which can also be increased or reduced according to practical requirements. The liquid inlet apertures 3 are distributed uniformly and regularly, such as uniformly distributed along the circumference of the inner wall. The liquid inlet apertures 3 are preferably to be round, with a diameter of 0.5 cm to 1.5 cm. In other embodiments, the liquid inlet apertures 3 can also be triangle, square, pentagram or other shaped. The inner wall is preferably to be thinner for introducing liquids into the hollow cavity 4 through the liquid inlet apertures 3 more easily. The thickness of the outer wall can be determined as appropriate while ensuring the total strength of the upper casing 1. The thickness of the inner wall can be smaller than or equal to that of the outer wall. The thickness of the hollow cavity 4 is 0.3 cm to 0.8 cm, which can also be determined in accordance with that of the inner wall and the outer wall and preferably to be determined so as to make the sputtered liquid flow more smoothly in the hollow cavity 4 as long as the total strength of the upper casing 1 is ensured.

Furthermore, the lower casing 2 is provided with liquid discharging apertures (not shown), which are communicated with the bottom of the hollow cavity 4, for discharging the liquids flowed therein from the bottom of the hollow cavity 4. The waste liquids produced during the cleaning process are collected in the hollow cavity 4 and then discharged from the liquid discharging aperture, which makes the collection of the waste liquids more easily.

The cleaning device can be applied in the cleaning process of the wafer 6. The cleaning process comprises the following steps:

Step S1, before the beginning of the cleaning process, the upper casing 1 is driven up through the driving column 5 by an air cylinder to make the lower portion of the upper casing 1 overlap with at least parts of the top portion of the lower casing 2; then the wafer 6 is placed on the chuck 7 which comprises clamping elements 8 for clamping the wafer 6.

Step S2, during the cleaning process, the wafer 6 is rotated with the chuck 7 at a high speed while the upper casing 1 and the lower casing 2 of the cleaning device remain stationary. The sputtered liquids from the high speed rotating wafer 6 are introduced into the hollow cavity 4 through the liquid inlet apertures 3, some of the sputtered liquids which are backsplashed from the hollow cavity 4 will be split and broken in collision with the liquid inlet apertures 3, so that the return of the sputtered liquids to the wafer 6 surface can be prevented. The liquids in the hollow cavity 4 flow into the liquid discharging apertures in the lower casing 2 from the bottom of the upper casing 1 and then are discharged through the liquid discharging apertures.

Step S3, when the cleaning process is completed, the lower casing 2 is driven down through the driving column 5 by the air cylinder. The chuck 7 is in an object-release state in which the wafer can be released.

It is noted that, in the Step S1 when the upper casing 1 is driven up to a high position, the lower portion of the upper casing 1 overlaps with at least parts of the top portion of the lower casing 2 so as to make sure that the liquids introduced into the hollow cavity 4 from the liquid inlet apertures 3 and discharged from the bottom of the hollow cavity 4 can flow into and out of the liquid discharging apertures in the lower casing 2. In the Step S3 when the upper casing 1 is driven down to a low position, the upper casing 1 and the lower casing 2 are substantially overlapped.

According to the cleaning device resistant to liquid backsplash of the present invention, the upper casing is provided with liquid inlet apertures and a hollow cavity, so that the chemical liquids and/or particles used are introduced into the hollow cavity through the liquid inlet apertures and discharged through the liquid discharging apertures during the high speed rotation of the wafer. Some amount of the liquids backsplashed from the hollow cavity are further split and broken in collision with the liquid inlet apertures and are incapable of sputtering back to the wafer surface, thereby preventing the backsplashed liquids which collides with the side wall of the cleaning chamber and returns to the wafer surface by using the conventional cleaning device from contaminating the wafer. Furthermore, the cleaning device is simple in structure and easy to clean, so that the cleaning process can be performed easily and the waste liquids produced during the cleaning process can be collected conveniently, thus to achieve better wafer cleaning effects.

Second Embodiment

Figure 2:
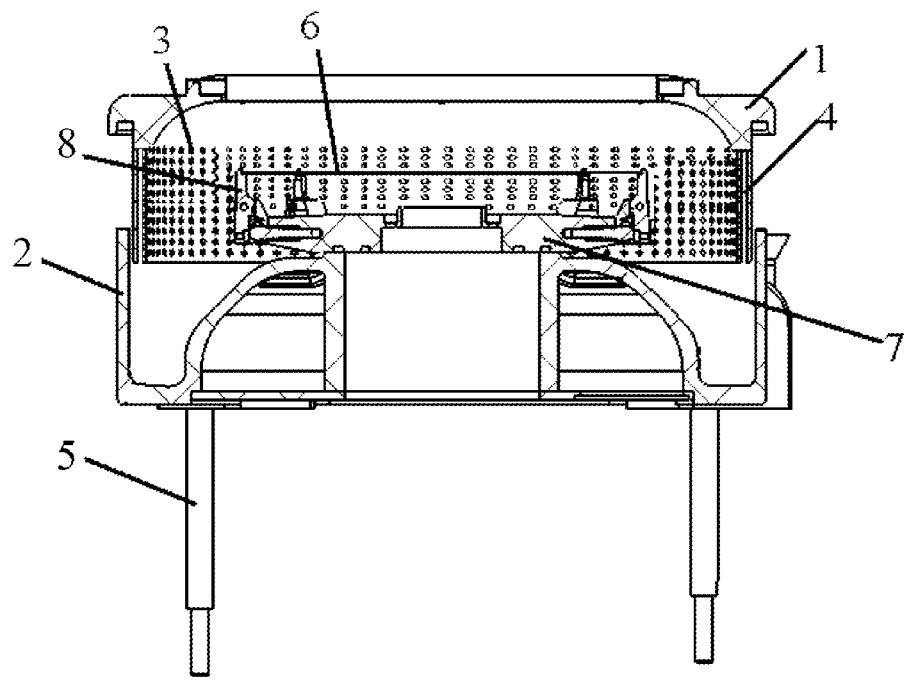
FIG. 2 is a sectional view showing a cleaning device with the cleaning device shown in the FIG. 1 according to an embodiment of the present invention.
Figure 3:
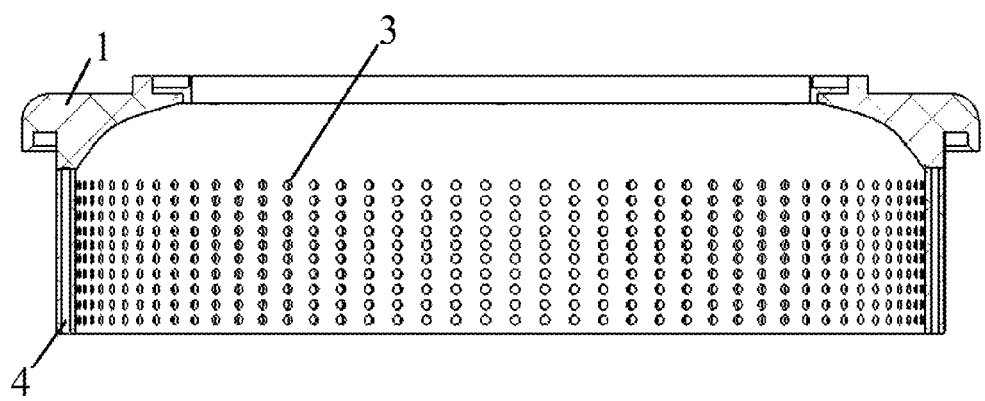
FIG. 3 is a sectional view showing the upper casing of the cleaning device according to an embodiment of the present invention.
Figure 4:
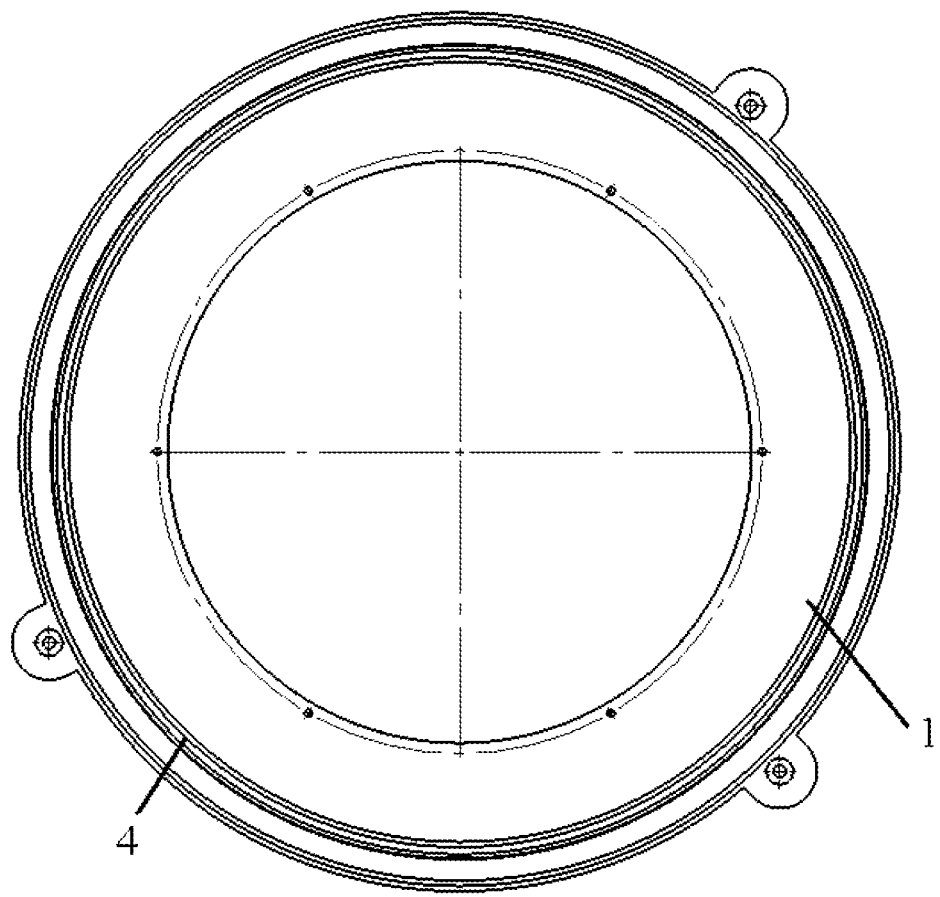
FIG. 4 is a bottom view showing the upper casing of the cleaning device according to an embodiment of the present invention.

As shown in FIG. 2, a cleaning system comprising the cleaning device resistant to liquid backsplash mentioned above is provided. The cleaning system also comprises a holder for clamping the object to be cleaned, which is the wafer 6 in the embodiment. The holder is positioned in the internal of the cleaning device. Specifically, the holder comprises a chuck 7 for supporting, clamping and rotating the wafer 6. The chuck 7 is provided with clamping elements 8 for clamping and releasing the wafer 6. During the cleaning process, the upper casing 1 is in a high position, the wafer 6 is rotated with the chuck 7 at a high speed and the chuck 7 remains in an object-clamp state; while after the completion of the cleaning process, the upper casing 1 is in a low position, the wafer 6 is stopped, and the chuck 7 remains in an object-release state ready to release the wafer 6.

According to the cleaning system of the present invention, the contamination to the wafer due to the liquid backsplash to the wafer surface caused by the sputtered chemical liquids and/or particles used in collision with the side wall of the inner casing can be prevented. The chemical liquids and/or particles which sputter at a circle tangent of the wafer are introduced into the hollow cavity through the liquid inlet apertures of the upper casing, and flow into the lower casing and flow out of by the liquid discharging apertures. Some of the sputtered liquids return from the hollow cavity collides with the liquid inlet apertures and are further split and broken, thus to be incapable of sputtering back to the wafer surface, thereby preventing the backsplashed liquids contaminating the wafer. Furthermore, the cleaning system is simple in structure and easy to clean, so that the cleaning process can be performed easily, the waste liquids produced during the cleaning process can be collected conveniently, and better wafer cleaning effects can be achieved.

It is noted that the cleaning device resistant to liquid backsplash as well as the cleaning system provided therewith are not only applicable in the cleaning process for disk-like objects such as the wafer, but also can be applied in cleaning processes for other objects in which sputtered liquid are produced. The operation of the cleaning device and the cleaning system is the same as the operation during the wafer cleaning process, and same cleaning effects can be achieved.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A cleaning device resistant to liquid backsplash, comprising:
   a lower casing;
   an upper casing moves upward and downward relative to the lower casing; wherein the upper casing is a non-solid structure comprising an inner wall, an outer wall having the same length with the inner wall, and a hollow cavity formed therebetween; the inner wall is provided with a plurality of liquid inlet apertures which are communicated with the hollow cavity for introducing liquids into the hollow cavity and preventing backsplash of the liquids; wherein the liquids flowed in the upper casing are discharged from the bottom of the hollow cavity, some amount of the liquids backsplashed from the hollow cavity are split and broken in collision with the liquid inlet apertures and are incapable of sputtering back;
   wherein the total combined thickness of the inner wall and the outer wall is in the range of 1.2 cm to 2 cm, the thickness of the inner wall is less than or equal to that of the outer wall;
   wherein, before the beginning of a cleaning process, the upper casing moves to a high position where the lower portion of the upper casing overlaps with at least arts of the top portion of the lower casing;
   during the cleaning process, the upper casing and the lower casing remain stationary;
   when the cleaning process is completed, the upper casing moves down to a low position where the upper casing and the lower casing are substantially overlapped.

2. The device according to claim 1, wherein the upper casing is connected with at least one driving column by which the upper casing moves upward and downward relative to the lower casing.

3. The device according to claim 1, wherein the thickness of the hollow cavity is 0.3 cm to 0.8 cm.

4. The device according to claim 1, wherein each of the liquid inlet apertures is round in shape and has a diameter in the range of 0.5 cm to 1.5 cm.

5. The device according to claim 1, wherein the liquid inlet apertures are uniformly distributed along the circumference of the inner wall.

6. The device according to claim 1, wherein the lower casing is provided with liquid discharging apertures which are communicated with the bottom of the hollow cavity.

7. A cleaning system comprising a cleaning device resistant to liquid backsplash, the cleaning device resistant to liquid backsplash comprises an upper casing and a lower casing, wherein the upper casing moves upward and downward relative to the lower casing; the upper casing is a non-solid structure comprising an inner wall, an outer wall having the same length with the inner wall, and a hollow cavity formed therebetween; the inner wall is provided with a plurality of liquid inlet apertures which are communicated with the hollow cavity for introducing liquids into the hollow cavity and preventing backsplash of the liquids; wherein the liquids flowed in the upper casing are discharged from the bottom of the hollow cavity, some amount of the liquids backsplashed from the hollow cavity are split and broken in collision with the liquid inlet apertures and are incapable of sputtering back;
   wherein the total combined thickness of the inner wall and the outer wall is in the range of 1.2 cm to 2 cm, the thickness of the inner wall is less than or equal to that of the outer wall;
   wherein, before the beginning of a cleaning process, the upper casing moves to a high position where the lower portion of the upper casing overlaps with at least arts of the top portion of the lower casing;
   during the cleaning process, the upper casing and the lower casing remain stationary;
   when the cleaning process is completed, the upper casing moves down to a low position where the upper casing and the lower casing are substantially overlapped.

8. The system according to claim 7, wherein the upper casing is connected with at least one driving column by which the upper casing moves upward and downward relative to the lower casing.

9. The system according to claim 7, wherein the thickness of the hollow cavity is 0.3 cm to 0.8 cm.

10. The system according to claim 7, wherein each of the liquid inlet apertures is round in shape and has a diameter in the range of 0.5 cm to 1.5 cm.

11. The system according to claim 7, wherein the liquid inlet apertures are uniformly distributed along the circumference of the inner wall.

12. The system according to claim 7, wherein the lower casing is provided with liquid discharging apertures which are communicated with the bottom of the hollow cavity.

13. The system according to claim 7, further comprises a holder positioned in the internal of the cleaning device, wherein the holder comprises a chuck for supporting, clamping and rotating the wafer.

* * * * *